(12) United States Patent
Hoshino

(10) Patent No.: US 6,707,157 B2
(45) Date of Patent: Mar. 16, 2004

(54) THREE DIMENSIONAL SEMICONDUCTOR INTEGRATED CIRCUIT DEVICE HAVING A PIERCING ELECTRODE

(75) Inventor: Masataka Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/982,963

(22) Filed: Oct. 22, 2001

(65) Prior Publication Data

US 2002/0027293 A1 Mar. 7, 2002

(30) Foreign Application Priority Data

Jun. 28, 2001 (JP) ........................................ 2001-196777

(51) Int. Cl.[7] ..................... H01L 23/12; H01L 23/48; H01L 23/52
(52) U.S. Cl. ......................................... 257/773; 257/778
(58) Field of Search .................................. 257/773, 778

(56) References Cited

U.S. PATENT DOCUMENTS 5,481,133 A * 1/1996 Hsu ........................... 257/621
6,222,276 B1 * 4/2001 Bertin et al. ................ 257/778

FOREIGN PATENT DOCUMENTS

JP          05-152529      * 6/1993    ......... H01L/27/092

* cited by examiner

*Primary Examiner*—W. David Coleman
(74) *Attorney, Agent, or Firm*—Westerman, Hattori, Daniels & Adrian, LLP

(57) ABSTRACT

A semiconductor device, includes a semiconductor substrate having a first surface and a second surface opposite the first surface, and having a piercing hole piercing there-through from the first surface to the second surface, an insulating film formed on the first surface of the semiconductor substrate having the piercing hole extended there-through and a piercing electrode formed in the piercing hole and extending from the insulating surface to the second surface, wherein the piercing hole has a first diameter in the insulating film and a second diameter in the semiconductor substrate which is wider than the first diameter, the piercing electrode has a substantially same diameter as the first diameter along a whole length thereof, and an insulating film sleeve lies between the piercing electrode and an inside wall of the piercing hole in the semiconductor substrate.

8 Claims, 11 Drawing Sheets

THREE DIMENSIONAL SEMICONDUCTOR INTEGRATED CIRCUIT DEVICE HAVING A PIERCING ELECTRODE

BACKGROUND OF THE INVENTION

1. Field of the Invention

The present invention generally relates to semiconductor devices, and more particularly, to a three dimensional semiconductor integrated circuit device on which semiconductor chips having a multi-layer interconnection structure are stacked up multiply, and a method for making the same.

2. Description of the Related Art

Various efforts for improving an integration density of a semiconductor integrated circuit device have been attempted for a long period of time. A three dimensional semiconductor integrated circuit device is considered an ultimate semiconductor integrated circuit device. Various proposals have been presented to realize the three dimensional semiconductor integrated circuit device.

FIG. 1 is a view showing a rough structure of a conventional three dimensional semiconductor integrated circuit device.

Referring to FIG. 1, a semiconductor integrated circuit device 1 includes a support substrate 10, and semiconductor chips 11A to 11D. A wire pattern 10A is formed on an upper surface side of the support substrate 10. A solder bump 10B is formed on a bottom surface side of the support substrate 10. The support substrate 10 has a number of semiconductor chips 11A to 11D stacked thereon. Respective semiconductor chips 11A to 11D include piercing electrodes 11a to 11d which pierce from upper surfaces to bottom surfaces of the respective semiconductor chips 11A to 11D. A two dimensional semiconductor integrated circuit is shouldered on the upper surfaces of the respective semiconductor chips 11A to 11D. In a state where the semiconductor chips 11A to 11D are piled up on the support board 10, a piercing electrode exposed from a bottom surface of a semiconductor chip comes in contact with an electrode pad formed on an upper surface of a lower semiconductor chip. Because of this, a three dimensional semiconductor integrated circuit device carrying out a designated function can be obtained. In the three dimensional semiconductor integrated circuit device, it is possible to form a complex circuit by connecting the piercing electrodes with a multi-layer interconnection structure.

FIGS. 2 to 9 are views respectively showing a forming process of a semiconductor chip 11A as an example of the above-described semiconductor chip.

Referring to FIG. 2, an active element, including a gate electrode 22 and diffusion areas 21A and 21B, is formed on a silicon substrate 21. The active element is covered with an inter layer dielectric 23. Contact holes for exposing the diffusion areas 21A and 21B are formed respectively in the inter layer dielectric 23. Conductive plugs 23A and 23B such as a W plug are respectively formed in the contact holes.

In a state shown in FIG. 2, a resist film 24 having a resist opening part 24A is formed on the inter layer dielectric 23. The inter layer dielectric 23 is done patterning by using the resist film 24 as a mask. An opening part 23C, corresponding to the piercing electrode 11a, is formed in the inter layer dielectric 23.

Following the process shown in FIG. 2, in a process shown in FIG. 3, the silicon substrate 21 is done dry-etching through the opening part 23C. A concave part 21C corresponding to the piercing electrode 11a is formed in the silicon substrate 21 as an extending part of the opening part 23C.

Following the process shown in FIG. 3, in a process shown in FIG. 4, a silicon nitride film 25 is formed by a chemical vapor deposition (CVD) method. The silicon nitride film 25 is piled up as covering the upper surface of the inter layer dielectric 23, an inside wall surface of the opening part 23C, and an inside wall surface including a bottom surface of the concave part 21C are covered continuously.

Following the process shown in FIG. 4, in a process shown in FIG. 5, a copper layer 26 is formed as follows. A titanium nitride film and a copper film are formed on the CVD-silicon nitride film 25 by the CVD method. Furthermore, electrolytic plating for a copper is carried out by using the CVD-copper film as a electrode, so that the copper layer 26 is formed on the silicon nitride film 25. The copper layer 26 is filled in the concave part 21C, so that it forms the plug 26C.

Following the process shown in FIG. 5, in a process shown in FIG. 6, the copper layer 26 on the inter layer dielectric 23 is removed by a chemical mechanical polishing (CMP) method.

After the process shown in FIG. 6, in a process shown in FIG. 7, a following inter layer dielectric 27 is formed on the inter layer dielectric 23. A copper wire pattern 27A is formed in the inter layer dielectric 27 by a damascene method.

Following the process shown in FIG. 7, in a process shown in FIG. 8, a following inter layer dielectric 28 is formed on the inter layer dielectric 27. A copper wire pattern 28A including a contact plug is formed in the inter layer dielectric 28 by a dual damascene method.

Following the process shown in FIG. 7, in a process shown in FIG. 8, as a last process, the bottom surface of the silicon substrate 21 is polished, so that the copper plug 26 is exposed. On the exposed copper plug 26, a diffusion prevention film 29A is formed on the copper plug 26C, so that a conductive pad 29B is formed. With the above-mentioned processes, the semiconductor chip 11A shown in FIG. 1 is obtained. In a structure shown in FIG. 9, the copper plug 26C corresponds to the piercing electrode 11a shown in FIG. 1.

According to processes of manufacturing the semiconductor chip 11A shown in FIGS. 2–9, in the process shown in FIG. 2 in which the concave part 21C is formed, a diameter of the concave part 21C is increased more than a diameter of the opening part 23C. Therefore, an overhang may be formed on an upper end part of the concave part 21C by the inter layer dielectric 23. The concave part 21C is 60 $\mu$m deep while the diameter of the opening part 23C generally has the diameter of 10 $\mu$m.

In a state where the overhang is formed on the upper end part of the concave part 21C in the process shown in FIG. 4, if the CVD-silicon nitride film is formed as covering the inside wall surface of the concave part 21C, forming the silicon nitride film on the upper end part of the concave part 21C which has a narrowed diameter, namely on the opening part 23C, has a tendency to be promoted. Therefore, an effective diameter of the opening part 23C becomes narrower. Hence, if the copper layer 26 is tried to be formed by the electrolytic plating in the process shown in FIG. 4, it becomes not-enough to grow the copper layer 26 inside of the concave part 21C. Thus, a problem in that a defect such as a cave 26c shown in FIG. 5 easily occurs inside of the copper plug 26C. The copper plug 26C plays an important role for comprising the piercing electrode 11a. Hence, if the defect occurs in the piercing electrode 11a, a reliability regarding the three dimensional semiconductor integrated circuit device shown in FIG. 1 will be reduced.

SUMMARY OF THE INVENTION

Accordingly, it is a general object of the present invention is to provide a method of manufacturing a novel and useful semiconductor device in which one or more of the problems described above are eliminated.

Another and more specific object of the present invention is to provide a semiconductor device including a piercing electrode in a semiconductor chip, acting at a high rate, and having high reliance, which can easily form a three dimensional semiconductor integrated circuit device by piling films. The object is also to provide a method of manufacturing the semiconductor device and a semiconductor integrated circuit device comprised of the semiconductor device.

The above objects of the present invention are achieved by a semiconductor device, including a semiconductor substrate having a first surface and a second surface opposite the first surface, and having a piercing hole piercing therethrough from the first surface to the second surface, an insulating film formed on the first surface of the semiconductor substrate having the piercing hole extended therethrough, and a piercing electrode formed in the piercing hole and extending from the insulating film to the second surface, wherein the piercing hole has a first diameter in the insulating film and a second diameter in the semiconductor substrate which is wider than the first diameter, the piercing electrode has a substantially same diameter as the first diameter along a whole length thereof, and an insulating film sleeve lies between the piercing electrode and an inside wall of the piercing hole in the semiconductor substrate.

The above objects of the present invention are also achieved by a method of manufacturing a semiconductor device having a piercing electrode, including a step of forming an insulating film on a first main surface of a semiconductor substrate, a step of forming an opening which exposes the semiconductor substrate and has a first diameter, in the insulating film, a step of forming a concave which has a second diameter wider than the first diameter in the semiconductor substrate and extends from the opening into the semiconductor substrate, by anisotropic etching which acts in a direction substantially perpendicular to the main surface of the semiconductor substrate and which utilizes the insulating film as a mask, a step of filling the opening and the concave with an application insulating film, a step of forming a space that continuously extends from the opening to a depth into the application insulating film filling the concave, by anisotropic etching which etches the application insulating film on a direction substantially perpendicular to the main surface of the semiconductor substrate and which utilizes the insulating film as a mask, a step of stacking a conductive layer on the insulating film as filling the opening and the space, a step of forming a conductive plug in the opening and the space by removing the conductive layer from the insulating film, and a step of exposing the conductive plug by a process of removing what covers the conductive plug and what stacks on a second main surface of the semiconductor substrate which is opposite to the first main surface from the second main surface.

According to the above invention, a defect in the piercing electrode formed in the semiconductor substrate is removed, so that it is possible to obtain a semiconductor device with high reliance.

Also, when the concave part becoming a piercing hole eventually is formed in the semiconductor substrate by using the insulating film formed on the semiconductor substrate as a hard mask, it is possible to form the application insulating film on a side wall surface of the concave part having a sleeve shape and a low relative permeability, by using an occurrence of an undercut accompanied by forming the concave part. It is possible to reduce a parasitic capacitance and a parasitic resistance, by filling a space which is surrounded by the sleeve with a low resistance material such as copper and by forming the conductive plug. Hence, an active rate of the semiconductor device is improved. Furthermore, the application insulating film is remained on not only a side wall surface but also the bottom surface of the concave part like a sheath. Therefore, if a width of the semiconductor substrate will be reduced by dry etching for the bottom surface of the semiconductor substrate, the semiconductor substrate is not damaged. The conductive plug typically made of copper is protected by the application insulating film. Hence, the conductive plug is projected from the bottom surface of the semiconductor substrate in a state where the conductive plug is covered with the application insulating film. The conductive plug can be electrically contacted on the bottom surface of the semiconductor substrate if the application insulating film is removed by the CMP method or the ashing in the above state. Hence, a contact pad is formed on the head end part of the conductive plug on the bottom surface of the semiconductor substrate. It is possible to construct the three dimensional semiconductor integrated circuit device acting at high rate with high reliance, by stacking the semiconductor device or the semiconductor chips manufactured as described above.

Other objects, features, and advantages of the present invention will be more apparent from the following detailed description when read in conjunction with the accompanying drawings.

DETAIL DESCRIPTION OF THE PREFERRED EMBODIMENTS

A description with respect to processes of manufacturing a semiconductor device of an embodiment according to the present invention, will now be given, with reference to the FIGS. 10 to 21.

Figure 1:
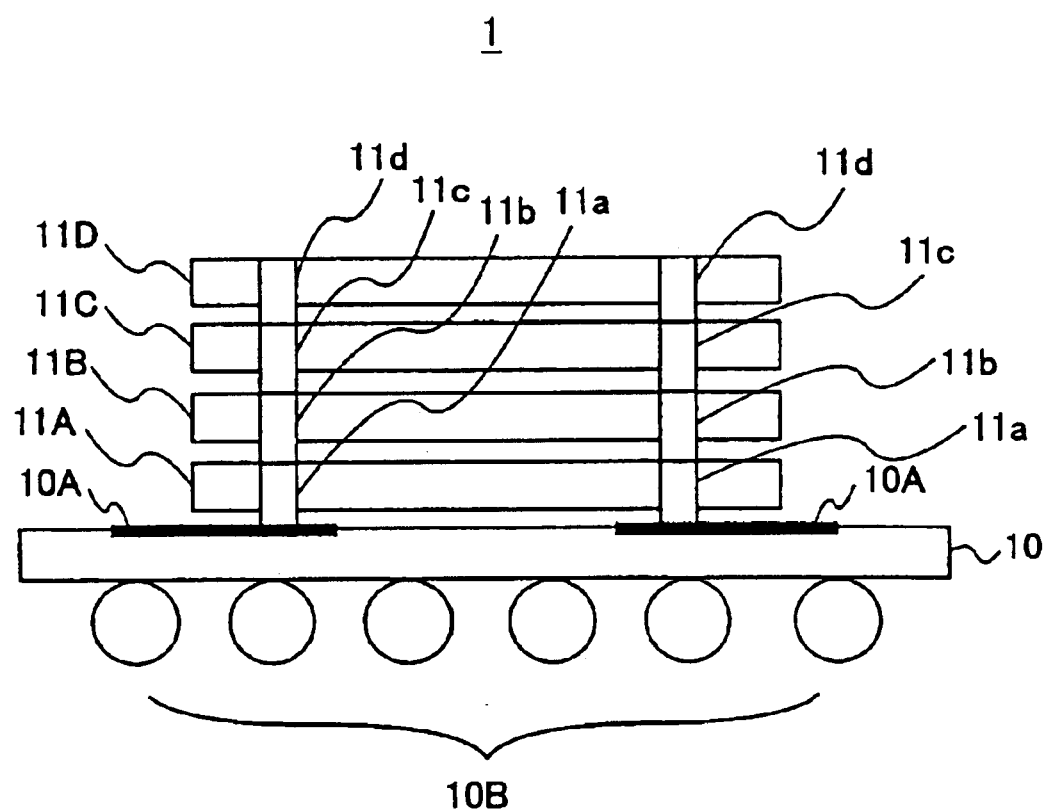
FIG. 1 is a view showing a structure of a conventional three dimensional semiconductor integrated circuit device.
Figure 2:
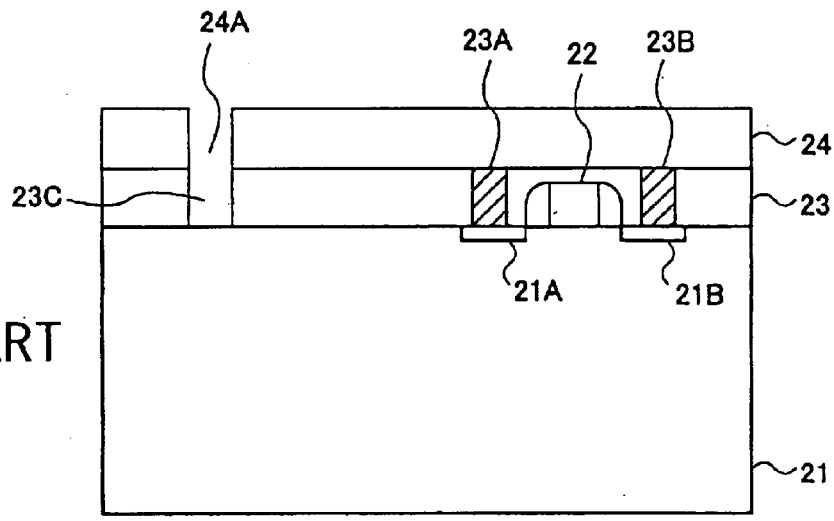
FIG. 2 is a view explaining a manufacturing process of a conventional semiconductor device.
Figure 3:
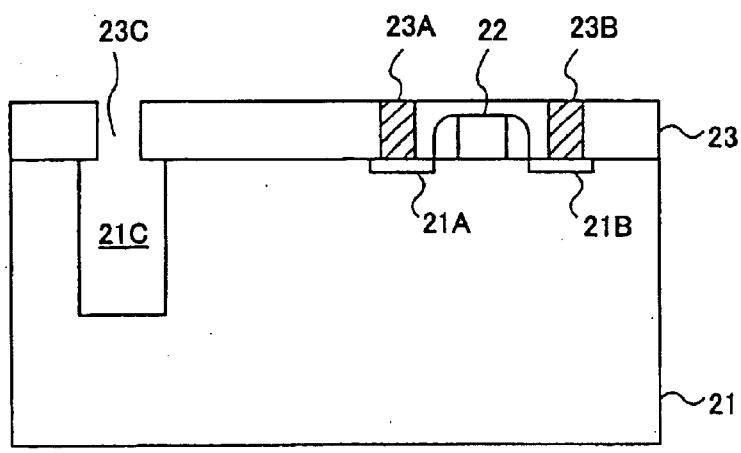
FIG. 3 is a view explaining a manufacturing process of a conventional semiconductor device.
Figure 4:
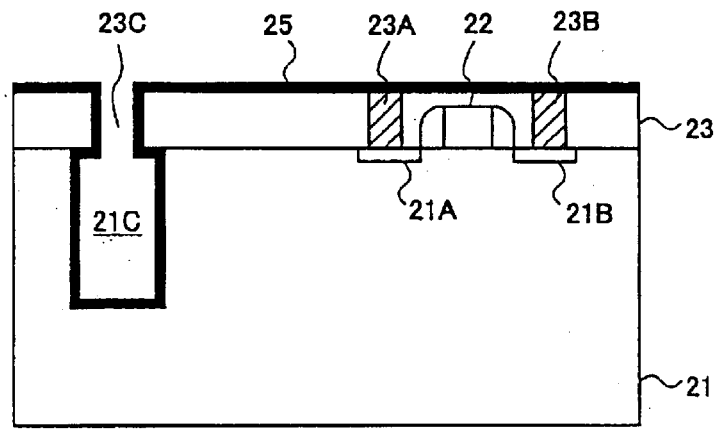
FIG. 4 is a view explaining a manufacturing process of a conventional semiconductor device.
Figure 5:
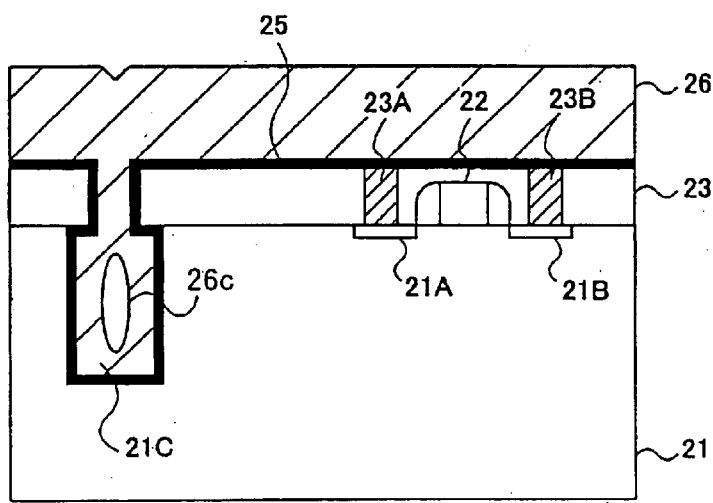
FIG. 5 is a view explaining a manufacturing process of a conventional semiconductor device.
Figure 6:
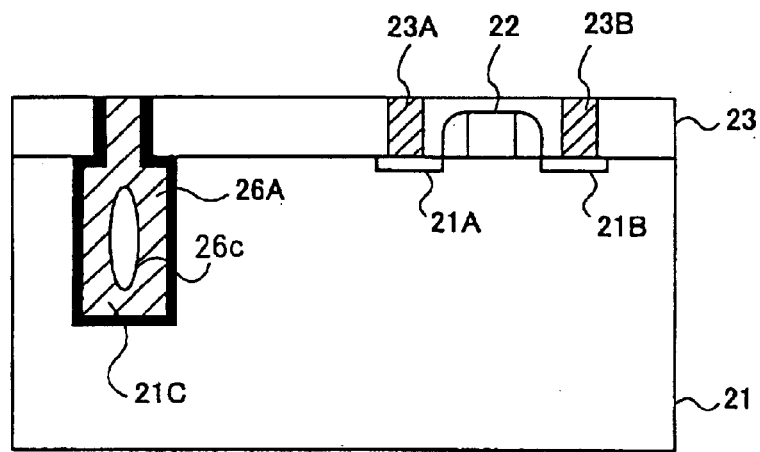
FIG. 6 is a view explaining a manufacturing process of a conventional semiconductor device.
Figure 7:
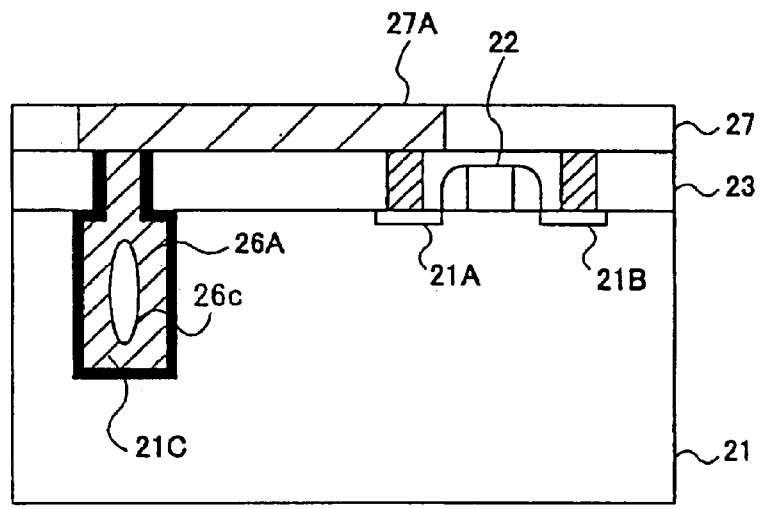
FIG. 7 is a view explaining a manufacturing process of a conventional semiconductor device.
Figure 8:
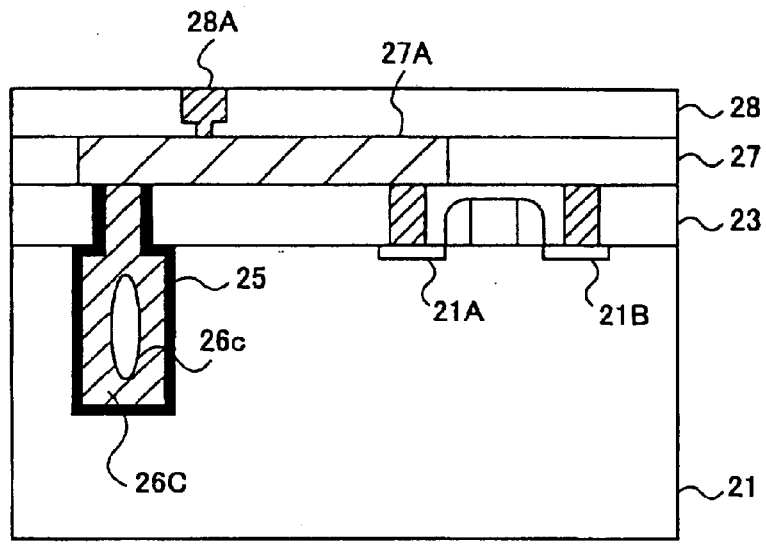
FIG. 8 is a view explaining a manufacturing process of a conventional semiconductor device.
Figure 9:
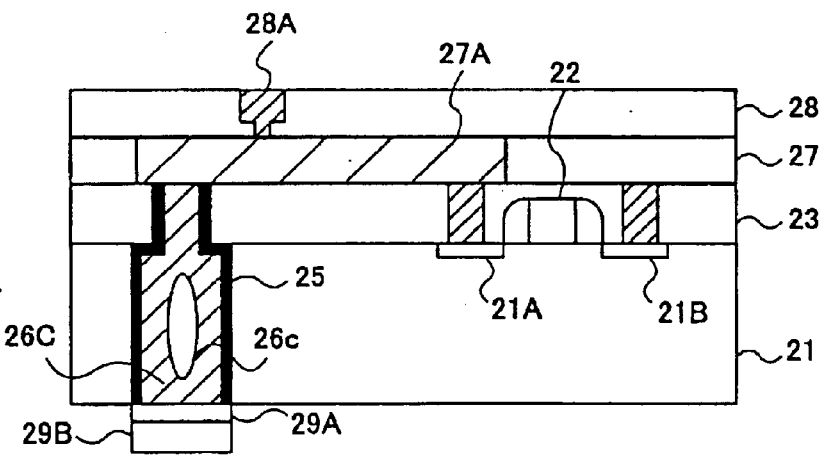
FIG. 9 is a view explaining a manufacturing process of a conventional semiconductor device.
Figure 10:
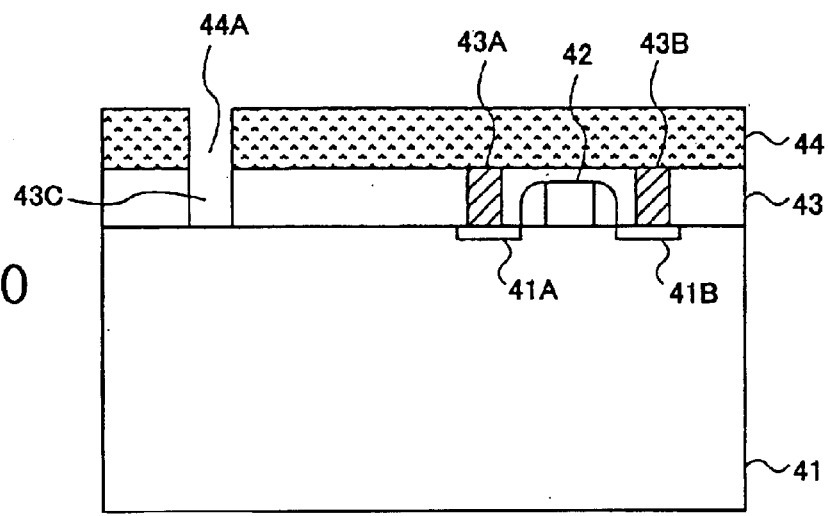
FIG. 10 is a view explaining a manufacturing process of a semiconductor device according to one example of the present invention.

Referring to FIG. 10, a gate electrode 42 is formed between diffusion areas 41A and 41B on a silicon substrate 41. A silicon dioxide film 43 is formed on the silicon substrate 41 as covering the gate electrode 42. A surface of the silicon dioxide film 43 is formed flatly. Conductive plugs 23A and 23B such as a W plug are respectively formed in the contact holes for exposing the diffusion areas 41A and 41B.

Furthermore, a resist film 44 is formed on the silicon dioxide film 43. A resist opening part 44A is formed in the resist film 44. The silicon dioxide film 43 is done etching at the resist opening part 44A, for instance by an etching gas of a carbon fluoride group. Therefore, an opening part 43C in the silicon dioxide film 43 exposes the silicon substrate 41 and is formed with a diameter of 10 $\mu$m.

Figure 11:
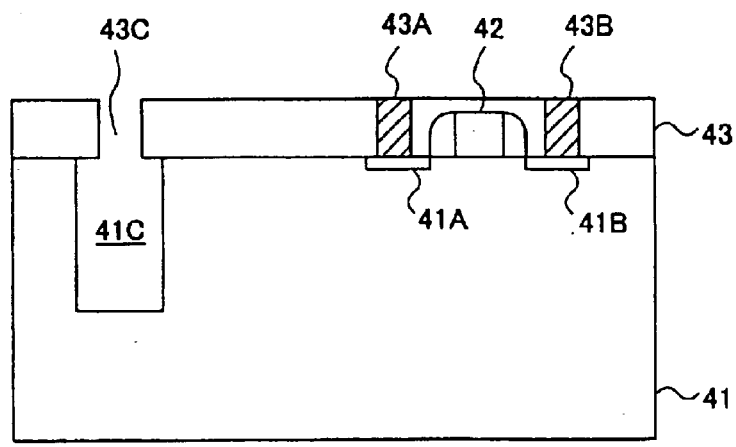
FIG. 11 is a view explaining a manufacturing process of a semiconductor device according to one example of the present invention.

Following the process shown in FIG. 10, in a process shown in FIG. 11, the silicon substrate 41 is done etching at the opening part 43C by reactive ion etching (RIE) method. A sulfur fluoride gas and a hydrocarbon gas are used reciprocally in the RIE method. Because of this, a concave part 41C is formed in the silicon substrate 41 as corresponding to the opening part 43C. The concave part 41C extends to an almost perpendicular direction against a main surface of the silicon substrate 41. The silicon dioxide film 43 is used as a hard mask and the etching is selectively done in the silicon substrate 41. During the etching, the concave part 41C expands to a side direction, so that the concave part 41C has a bigger diameter, for instance 11 $\mu$m, than the diameter of the opening part 43C.

Figure 12:
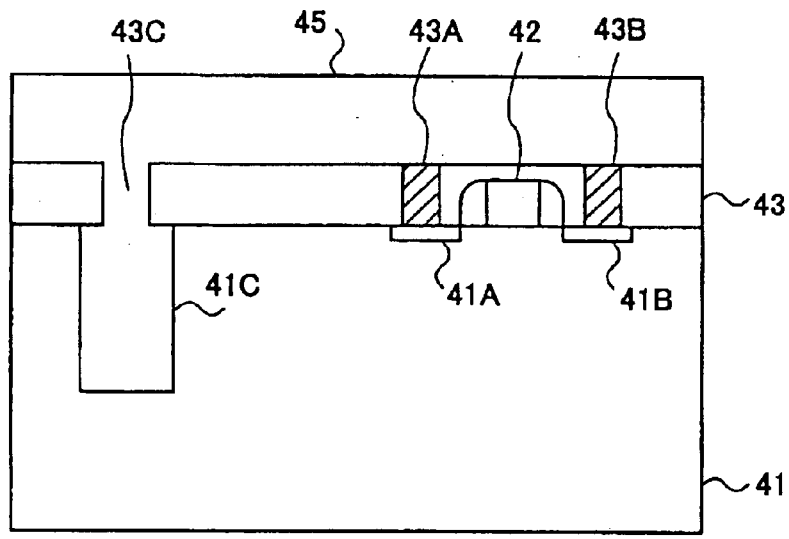
FIG. 12 is a view explaining a manufacturing process of a semiconductor device according to one example of the present invention.

Following the process shown in FIG. 11, in a process shown in FIG. 12, an application insulating film 45 having a low relative permeability is formed on a structure shown in FIG. 11 by spin coating. As the application insulating film, an organosiloxane group application insulating film, a siloxane hydroxide application insulating film, an organic polymer, or a porous application insulating film which is made of the above-mentioned materials, can be used. These application insulating films generally have a low relative permeability of 3.0 and under.

Figure 13:
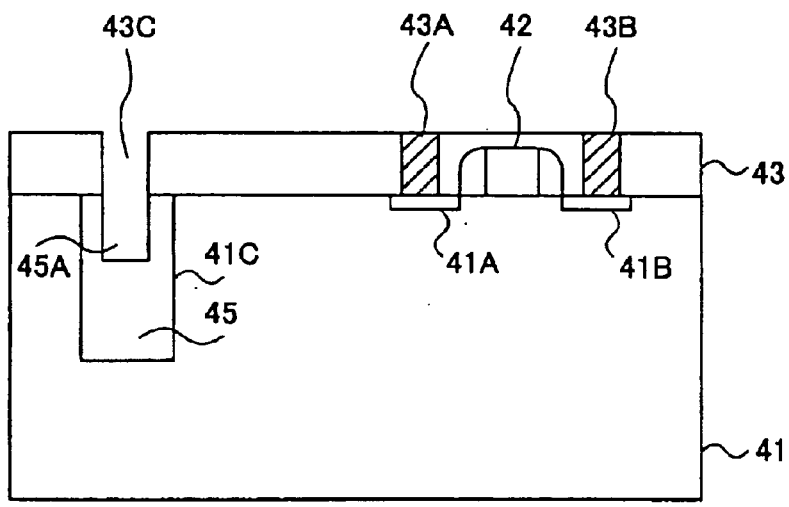
FIG. 13 is a view explaining a manufacturing process of a semiconductor device according to one example of the present invention.

Following the process shown in FIG. 12, in a process shown in FIG. 13, after the application insulating film 45 is cured, the application insulating film 45 is done etching by the RIE method in which the oxygen plasma is used. During the etching, the silicon dioxide film 43 is used as a mask and the application insulating film 45 is etched to an almost perpendicular direction against the silicon substrate 41. Because of this, a space 45A is formed in the application insulating film 45 filling in the concave part 41C and extends to an almost perpendicular direction against a main surface of the silicon substrate 41. FIG. 13 shows a state in which the application insulating film 45 is removed from the silicon dioxide film 43 as a result of the RIE etching.

Figure 14:
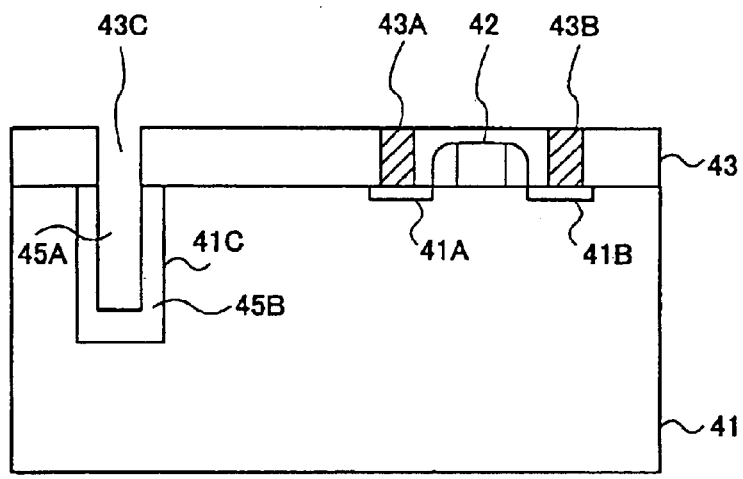
FIG. 14 is a view explaining a manufacturing process of a semiconductor device according to one example of the present invention.

By continuing doing RIE etching process shown in FIG. 13, a diameter of the space 45A becomes the substantially same as that of the opening part 43C. A remained application insulating film 45 forms a sleeve 45B along the inside wall of the concave part 41C as shown in FIG. 14. FIG. 14 shows a state in which the application insulating film 45 is remained on not only the inside wall but also a base part of the concave part 41C.

Figure 15:
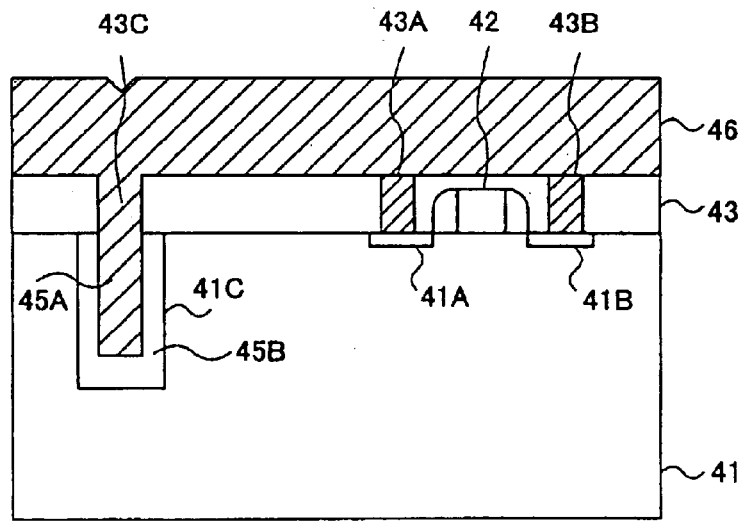
FIG. 15 is a view explaining a manufacturing process of a semiconductor device according to one example of the present invention.

Following the process shown in FIG. 14, in a process shown in FIG. 15, a titanium nitride film and a copper film, not shown in FIG. 15, are formed in sequence by the CVD method. They are formed as equally covering a surface of the silicon dioxide film 43, an inside wall surface of the opening part 43C, and an inside wall surface of the space 45A. Furthermore, a copper layer 46 is formed by electrolytic plating to a seed layer. The copper layer 46 is formed on the silicon dioxide film 43 as filling the opening part 43C and the space 45A consecutively. In this embodiment, the silicon nitride film or the like is not formed on the surface of the silicon dioxide film 43. Hence, the diameter of the opening part 43C does not become narrow, so that a void is not formed in the concave part 41C when the copper layer 26 is formed.

Figure 16:
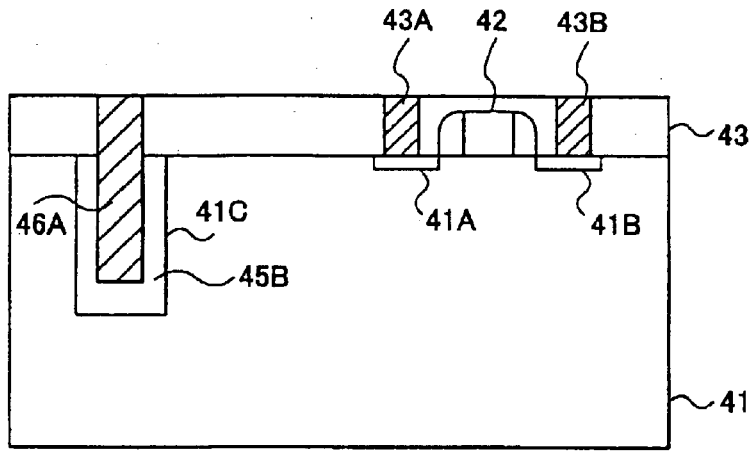
FIG. 16 is a view explaining a manufacturing process of a semiconductor device according to one example of the present invention.

Following the process shown in FIG. 15, in a process shown in FIG. 16, the copper layer 46 is removed from the surface of the silicon dioxide film 43 by the CMP method, so that a copper plug 46A is formed in the concave part 41C. As shown in FIG. 16, the copper plug 46A is formed in a state where it is surrounded by the application insulating film sleeve 45B in the concave part 41C.

Figure 17:
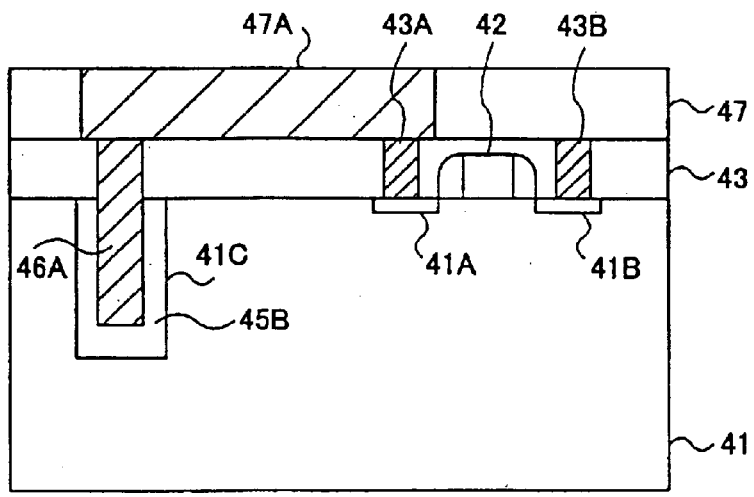
FIG. 17 is a view explaining a manufacturing process of a semiconductor device according to one example of the present invention.

Following the process shown in FIG. 16, in a process shown in FIG. 17, a following inter layer dielectric 47 is formed on the silicon dioxide film 43. Next, a damascene process in which a wire groove formed in the inter layer dielectric 47 is filled with the copper layer, is carried out. As a result of this, a copper wire pattern 47A is formed in the wire groove.

Figure 18:
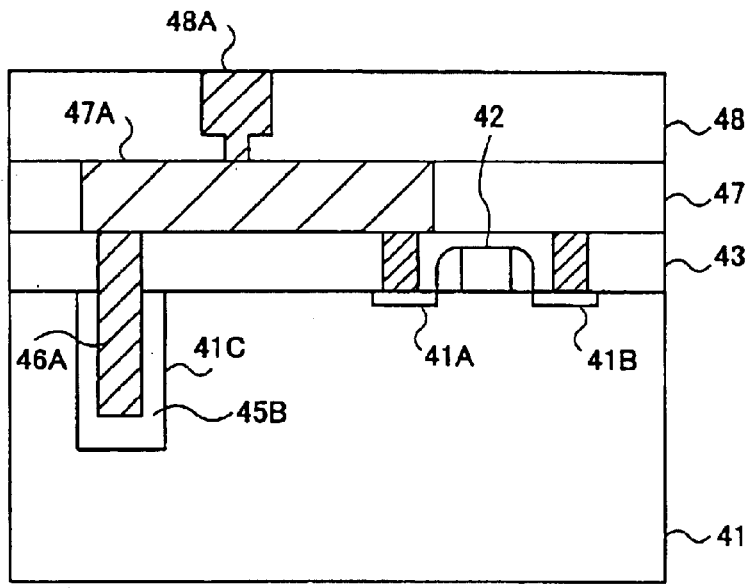
FIG. 18 is a view explaining a manufacturing process of a semiconductor device according to one example of the present invention.

Following the process shown in FIG. 17, in a process shown in FIG. 18, a following inter layer dielectric 48 is formed on the inter layer dielectric 47. A copper wire pattern 48A including a contact plug is formed in the inter layer dielectric 48 by a dual damascene method.

Figure 19:
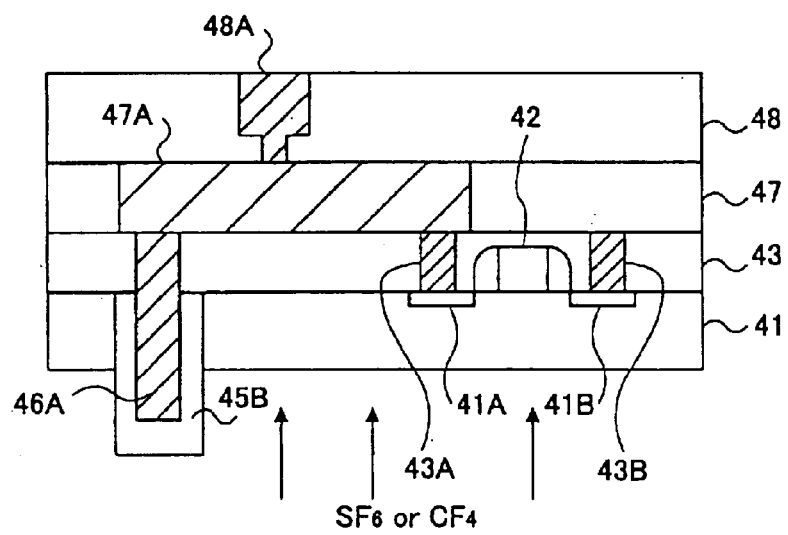
FIG. 19 is a view explaining a manufacturing process of a semiconductor device according to one example of the present invention.

Following the process shown in FIG. 18, in a process shown in FIG. 19, the RIE process in which the carbon fluoride or sulfur fluoride is used as an etching gas, is applied to the bottom surface of the silicon substrate 41. Because of this, a width of the silicon substrate 41 is reduced. In the process shown in FIG. 19, firstly the bottom surface of the silicon substrate 41 may be polished and then the RIE process may be applied. As shown in FIG. 19, the RIE process is carried out until the copper plug 46A is projected onto the bottom surface of the silicon substrate 41 in a state where the copper plug 46A is covered with the application insulating film sleeve 45B. It is preferable that the application insulating film is a film having a low permittivity such as a benzocyclobutene (BCB) which is tolerant to the RIE process.

Figure 20:
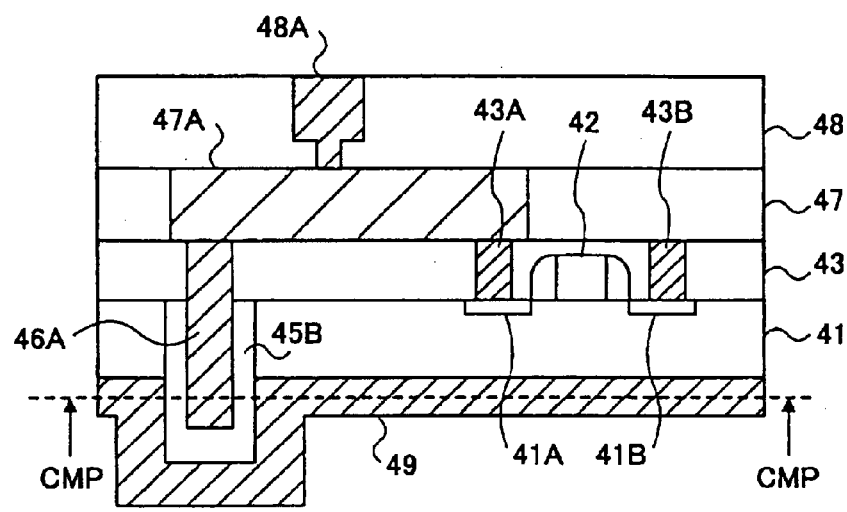
FIG. 20 is a view explaining a manufacturing process of a semiconductor device according to one example of the present invention.

Following the process shown in FIG. 19, in a process shown in FIG. 20, a copper layer 49 is formed on the bottom surface of the silicon substrate 41, with almost equal width through a diffusion prevention film such as a titan nitride, not shown. And then, the copper layer 49 is polished by a position shown with a dotted line, by the CMP method, so that the copper plug 46A is exposed.

Figure 21:
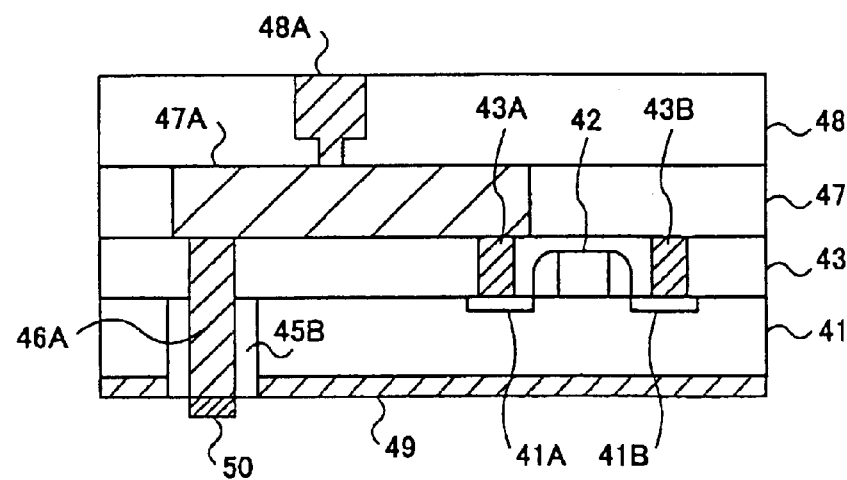
FIG. 21 is a view explaining a manufacturing process of a semiconductor device according to one example of the present invention.

Following the process shown in FIG. 20, in a process shown in FIG. 21, a contact pad 50 such as a gold is formed on an end surface of the exposed copper plug 46A through a diffusion prevention film such as a titan nitride, not shown.

In case of that the bottom surface of the silicon substrate 41 is polished directly and the copper plug 46A is exposed in a structure shown in FIG. 18, a problem occurs. That is, both the silicon substrate 41 and the copper plug 46A are polished simultaneously, so that a contamination with respect to the silicon dioxide film 43 occurs. However, according to the process shown in FIG. 20, the above-mentioned problem can be avoided.

An application insulating film having a relative permeability of 3.0 and under is preferable to use as the application insulating film 45. The application insulating film 45, however, is not limited to the above but the application insulating film such as a Spin-on Glass (SOG) may be used as well.

Furthermore, in the process shown in FIG. 19, the application insulating film covering a head end part of the copper plug 46A projecting onto the bottom surface of the silicon substrate 41 may be removed by an ashing process.

If the semiconductor device 40 manufactured by the above described processes is used instead of the semiconductor chips 11A to 11D, it is possible to manufacture the three dimensional semiconductor integrated circuit device which can active at a high rate with high reliance.

The present invention is not limited to these embodiments, but various variations and modifications may be made without departing from the scope of the present invention.

This patent application is based on Japanese priority patent application No. 2001-196777 filed on Jun. 28, 2001, the entire contents of which are hereby incorporated by reference.

What is claimed is:

1. A semiconductor device, comprising:
  a semiconductor substrate having a first surface and a second surface opposite the first surface, and having a piercing hole piercing there-through from the first surface to the second surface;
  an insulating film formed on the first surface of the semiconductor substrate having the piercing hole extended there-through; and
  a piercing electrode formed in the piercing hole and extending from the insulating film to the second surface,
  wherein the piercing hole is formed by using the insulating film as an etching mask;
  the piercing hole has a first diameter in the insulating film and a second diameter in the semiconductor substrate which is wider than the first diameter;
  the piercing electrode has a substantially same diameter as the first diameter along a whole length thereof; and
  an insulating film sleeve lies only between the piercing electrode and an inside wall of the piercing hole in the semiconductor substrate.

2. The semiconductor device as claimed in claim 1, wherein the insulating film sleeve is made of an organosiloxane group material, a siloxane hydroxide group material, an organic polymer, or a porous material of the organosiloxane group material, the siloxane hydroxide group material, or the organic polymer.

3. The semiconductor device as claimed in claim 1, wherein the insulating film sleeve has a relative permeability of approximately 3.0 and under.

4. The semiconductor device as claimed in claim 1, wherein the piercing electrode is made of a metal whose main component is a copper.

5. A semiconductor integrated circuit device, comprising:
  a support substrate; and
  a plurality of semiconductor chips stacked on the support substrate;
  the semiconductor chip including
    a semiconductor substrate;
    a semiconductor element formed on a first surface of the semiconductor chip;
    an insulating film formed on the first surface of the semiconductor chip as covering the semiconductor element;
    a multi-layer interconnection structure formed on the insulating film;
    a piercing hole formed in the semiconductor chip as piercing from the first surface into the insulating film through a second surface facing to the first surface; and
    a piercing electrode formed in the piercing hole and extending from the first surface to the second surface;
  wherein the piercing hole is formed by using the insulating film as an etching mask;
  the piercing hole has a first diameter in the insulating film and a second diameter in the semiconductor chip which is bigger than the first diameter;
  the piercing electrode has a substantially same diameter as the first diameter along whole length; and
  an insulating film sleeve lies only between the piercing electrode and an inside wall of the piercing hole in the semiconductor substrate.

6. The semiconductor integrated circuit device as claimed in claim 5, wherein the insulating film sleeve is made of an organosiloxane group material, a siloxane hydroxide group material, an organic polymer, or a porous material of the organosiloxane group material, the siloxane hydroxide group material, or the organic polymer.

7. The semiconductor integrated circuit device as claimed in claim 5, wherein the insulating film sleeve has a relative permeability of approximately 3.0 and under.

8. The semiconductor integrated circuit device as claimed in claim 5, wherein the piercing electrode is made of a metal whose main component is a copper.

* * * * *